United States Patent
Kaufmann et al.

(10) Patent No.: US 9,867,316 B2
(45) Date of Patent: Jan. 9, 2018

(54) COOLING APPARATUS FOR SWITCHGEAR WITH HEAT PIPE STRUCTURE HAVING INTEGRATED BUSBAR TUBE

(71) Applicant: ABB Technology AG, Zurich (CH)

(72) Inventors: Patrik Kaufmann, Baden (CH); Tilo Buehler, Othmarsingen (CH); Gabriel Schuler, Arth (CH); Peter Unternaehrer, Wurenlos (CH)

(73) Assignee: ABB Schweiz AG, Baden (CH)

( * ) Notice: Subject to any disclaimer, the term of this patent is extended or adjusted under 35 U.S.C. 154(b) by 535 days.

(21) Appl. No.: 14/376,634

(22) PCT Filed: Mar. 13, 2013

(86) PCT No.: PCT/EP2013/055169
§ 371 (c)(1),
(2) Date: Aug. 5, 2014

(87) PCT Pub. No.: WO2013/139666
PCT Pub. Date: Sep. 26, 2013

(65) Prior Publication Data
US 2015/0047372 A1    Feb. 19, 2015

Related U.S. Application Data

(60) Provisional application No. 61/614,003, filed on Mar. 22, 2012.

(51) Int. Cl.
*H05K 7/20* (2006.01)
*H01H 9/52* (2006.01)
(Continued)

(52) U.S. Cl.
CPC .......... *H05K 7/20336* (2013.01); *H01H 9/52* (2013.01); *H02B 1/56* (2013.01); *H05K 7/20309* (2013.01);
(Continued)

(58) Field of Classification Search
CPC ............... H01H 1/62; H01H 2009/523; H01H 2033/6613; H01B 7/423
See application file for complete search history.

(56) References Cited

U.S. PATENT DOCUMENTS

| | | | | |
|---|---|---|---|---|
| 3,662,137 A | * | 5/1972 | Cleaveland | H01H 1/62 165/104.26 |
| 3,769,551 A | | 10/1973 | Corman et al. | |
| 3,829,740 A | * | 8/1974 | Beasley | F28D 15/02 165/104.33 |
| 4,005,297 A | | 1/1977 | Cleaveland | |
| 4,358,631 A | * | 11/1982 | Matsuda | H01B 17/54 174/15.2 |

(Continued)

FOREIGN PATENT DOCUMENTS

| | | |
|---|---|---|
| DE | 102009023866 A1 | 12/2010 |
| FR | 2951857 A1 | 4/2011 |
| GB | 1390908 A1 | 4/1975 |

OTHER PUBLICATIONS

Office Action in CN2013800122553 and English translation thereof dated Apr. 5, 2016.

(Continued)

*Primary Examiner* — Cassey D Bauer
(74) *Attorney, Agent, or Firm* — Manelli Selter PLLC; Edward J. Stemberger

(57) ABSTRACT

A cooling apparatus is provided for a switchgear. The switchgear has one or more primary contacts constructed and arranged to connect to a terminal of a circuit breaker. The cooling apparatus includes an evaporator constructed and arranged to be associated with each primary contact. A condenser is located at a higher elevation than the evaporator. Fluid conduit structure fluidly connects the evaporator with the condenser. A portion of the fluid conduit structure defines a busbar tube electrically connected with an associated primary contact and defining a busbar of the switchgear. Working fluid is in the evaporator so as to be heated to a (Continued)

vapor state, with the fluid conduit structure being constructed and arranged to transfer the vapor to the condenser and to passively return condensed working fluid back to the evaporator for cooling the at least one primary contact and the associated busbar tube.

17 Claims, 5 Drawing Sheets

(51) Int. Cl.
  *H02B 1/56* (2006.01)
  *H01H 33/66* (2006.01)
  *H02B 11/04* (2006.01)
(52) U.S. Cl.
  CPC ... *H05K 7/20318* (2013.01); *H01H 2009/523* (2013.01); *H01H 2009/526* (2013.01); *H01H 2033/6613* (2013.01); *H02B 11/04* (2013.01)

(56) References Cited

U.S. PATENT DOCUMENTS

| | | | | |
|---|---|---|---|---|
| 2008/0000879 | A1* | 1/2008 | Steffens | H01H 1/62 218/124 |
| 2010/0302715 | A1* | 12/2010 | Bortoli | H01H 9/52 361/676 |
| 2010/0304590 | A1* | 12/2010 | Frassineti | H01H 1/58 439/196 |

OTHER PUBLICATIONS

Search Report in CN2013800122553 dated Mar. 9, 2016.
International Search Report & Written Opinion in PCT/EP2013/055169 dated Jun. 3, 2013.

* cited by examiner

US 9,867,316 B2

COOLING APPARATUS FOR SWITCHGEAR WITH HEAT PIPE STRUCTURE HAVING INTEGRATED BUSBAR TUBE

FIELD

The invention relates to switchgear circuit breakers and, more particularly, to a cooling apparatus wherein the busbars are incorporated in the heat pipe structure for cooling thereof.

BACKGROUND

Switchgear configurations have current limits based on the heat rise over ambient room temperature. It is generally desired to limit the maximum temperature of the hottest spot on the switchgear main bus to 105° C. (a rise of 65° C. over an assumed ambient temperature of 40° C.), as directed by the standard IEEE 37.20.2. Typical medium and high-voltage metal-clad switchgear arrangements have maximum continuous current ratings of about 3000 A, due to heat generation. It is desirable to increase this current rating to about 4000 A.

A heat pipe can be attached in a retrofitted manner to the primary contact, which is the major hotspot in the actual switchgear assembly and the additional heat can be removed from the primary contacts by means of an evaporative cooling system having a condenser. While the contacts are cooled very efficiently, other parts more remote from the heat pipe (e.g., busbar joints) tended to overheat and need additional cooling enhancement (e.g., finned surface, heat spreader). Furthermore, the space inside of the switchgear compartments is very tight and optimized for the busbar electric clearance distance. The retrofitted heat pipe system needs to match this boundary condition. The tubing reaching from the primary contact to the condenser sitting on top of the switchgear enclosure is disposed beside the electrical supply system. In particular an insulated tubing section is constrained by the narrow space behind the primary contacts.

Thus, there is a need to provide a cooling apparatus for a switchgear that not only cools the primary contacts but also cools the busbars, without interfering with the electrical safety of the switchgear.

SUMMARY

An object of the invention is to fulfill the need referred to above. In accordance with the principles of the present invention, this objective is achieved by providing a cooling apparatus for a switchgear. The switchgear has one or more primary contacts constructed and arranged to connect to a terminal of a circuit breaker. The cooling apparatus includes an evaporator constructed and arranged to be associated with each primary contact. A condenser is located at a higher elevation than the evaporator. Fluid conduit structure fluidly connects the evaporator with the condenser. A portion of the fluid conduit structure defines a busbar tube electrically connected with an associated primary contact and defining a busbar of the switchgear. Working fluid is in the evaporator so as to be heated to a vapor state, with the fluid conduit structure being constructed and arranged to transfer the vapor to the condenser and to passively return condensed working fluid back to the evaporator for cooling the at least one primary contact and the associated busbar tube.

In accordance with another aspect of the invention, a method of cooling a switchgear is provided. The switchgear has at least one primary contact constructed and arranged to connect to a terminal of a circuit breaker. The method associates an evaporator with the primary contact. A condenser is located at a higher elevation than the evaporator. Fluid conduit structure fluidly connects the evaporator with the condenser, and a working fluid is provided in the evaporator. The method electrically connects a busbar tube, of the fluid conduit structure, with the primary contact to define a busbar of the switchgear. Heat is transferred from the primary contact and the busbar tube to the working fluid to cause the working fluid to evaporate in the evaporator with the evaporated vapor being delivered to the condenser via the fluid conduit structure. The working fluid that condenses in the condenser is passively returned to the evaporator via the fluid conduit structure.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings wherein like numbers indicate like parts, in which.

DETAILED DESCRIPTION OF THE EXEMPLARY EMBODIMENTS

Figure 1:
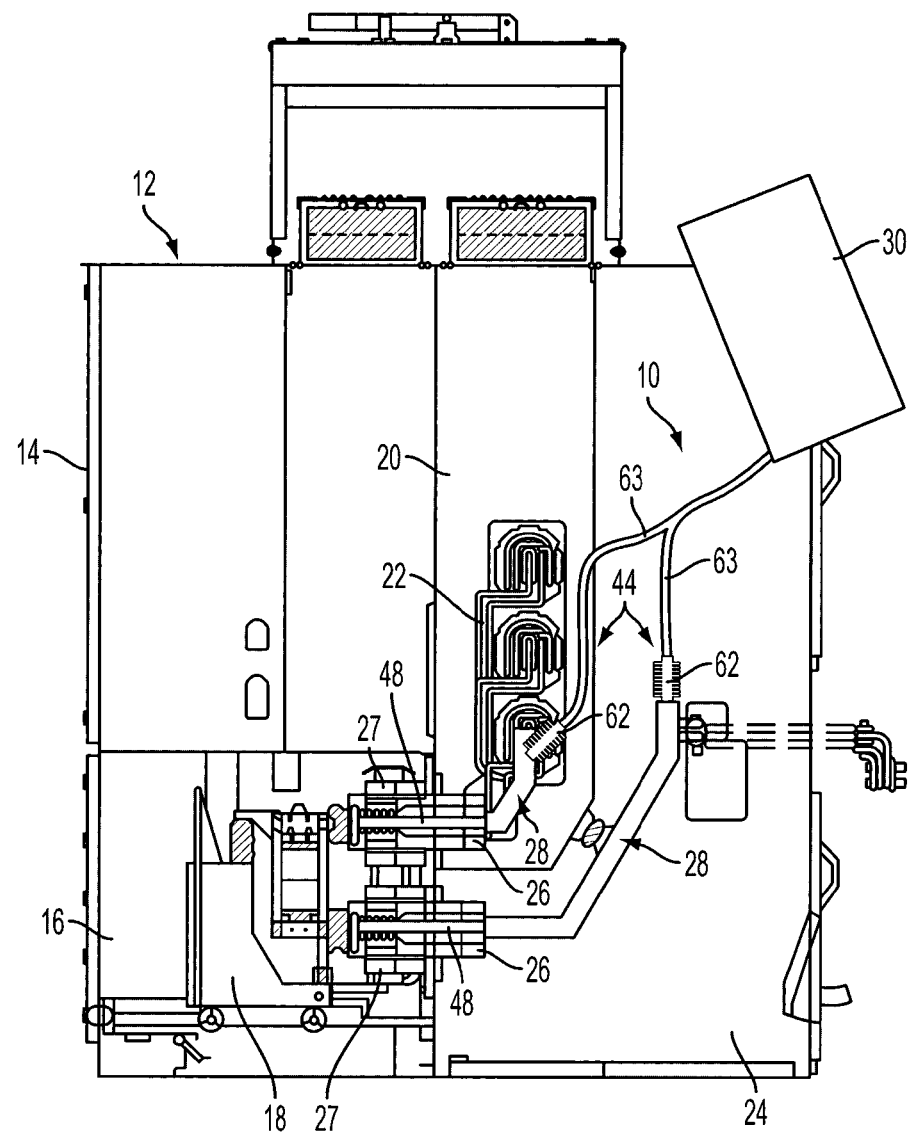
FIG. 1 is a view of an evaporative cooling apparatus in the form of a heat pipe structure in accordance with an embodiment, shown mounted in a switchgear.

With reference to FIG. 1, a cooling apparatus in the form of a heat pipe structure is shown, generally indicated at 10, mounted in a switchgear 12, generally indicated at 12. In the embodiment, the switchgear 12 is preferably an indoor, medium or high voltage metal-clad switchgear having a maximum continuous current rating of about 4000 Amp, but can be used for switchgear rated at about 2000 A. As used herein, the terms "medium voltage switchgear" and "high voltage switchgear" are used interchangeably, and refer to switchgear rated for operation at or exceeding 1 kV. In general, switchgear 12 comprises an enclosure, such as metal-clad enclosure 14, for housing the switchgear components. Enclosure 14 may contain one or more separate compartments, such as circuit breaker compartment 16, containing one or more circuit breakers 18, a main bus compartment 20 housing a main bus 22, and cable compartment 24. In the embodiment shown, circuit breaker 18 is a three-pole drawout type circuit breaker. Circuit breaker 18 is connected to primary contacts 26 that are supported by a primary bushing plate 27 and that are connected to current-carrying busbar tube structure, generally indicated at 28, associated with the main bus 22.

As noted above, the main bus 22 of the switchgear 12 has temperature rise restrictions that are measured relative to the ambient temperature. In accordance with the embodiment, the heat pipe structure 10 applies an evaporative recycling cooling arrangement with an evaporator located at convenient and critical points associated with the main bus 22, risers, cable connections, and/or primary contacts 26 and busbar structure 28, preferably where the conventional copper space plate is currently employed.

Figure 2A:
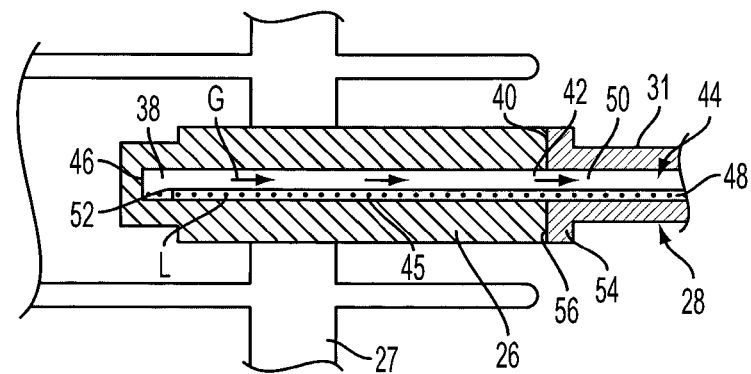
FIG. 2A is a sectional view of an embodiment of a primary contact fixed in a support bushing, showing an evaporator chamber in the primary contact and showing a portion of a liquid-return within a portion of a busbar tube.
Figure 2B:
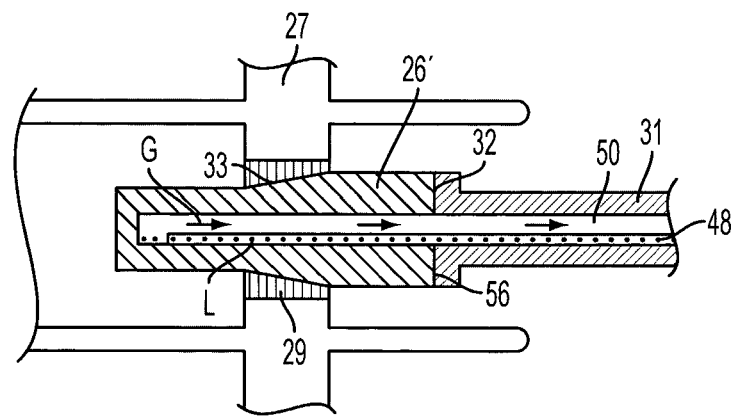
FIG. 2B is a sectional view of an embodiment of a primary contact that is removable from the support bushing, showing an evaporator chamber in the primary contact and showing a portion of a liquid-return within a portion of a busbar tube.
Figure 3:
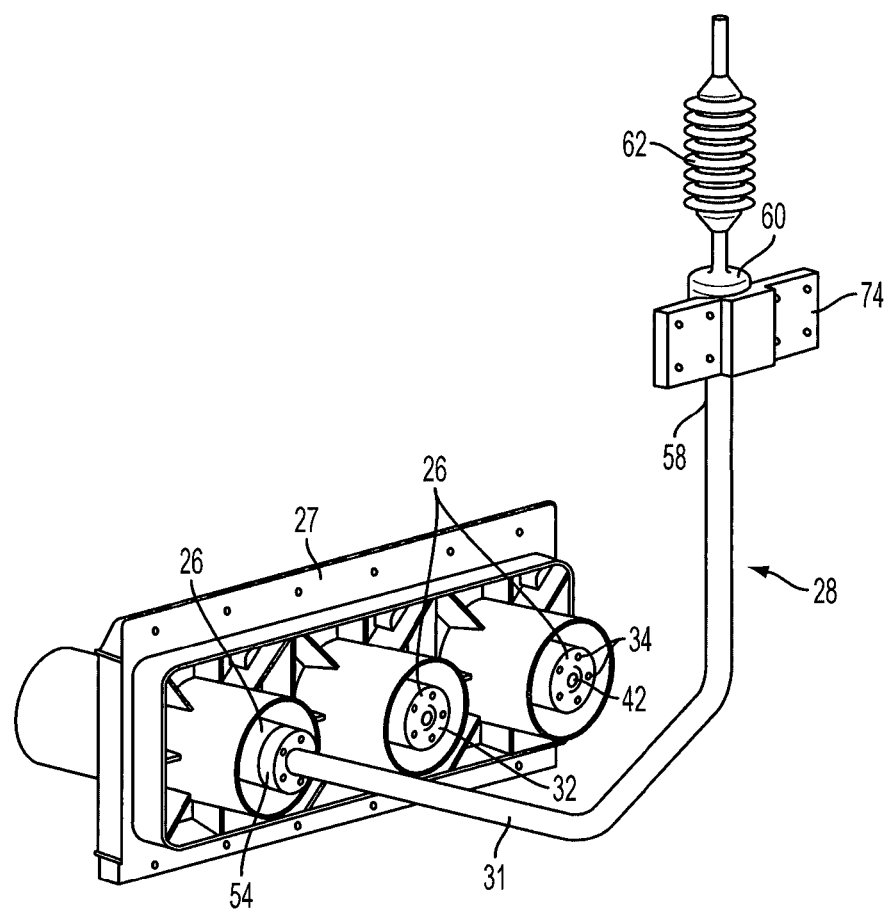
FIG. 3 is a view of a busbar tube attached to an associated primary contact in accordance with an embodiment.

With reference to FIGS. 2A, and 3, each primary contact 26 is fixedly seated to the bushing plate 27. Alternatively, with reference to FIG. 2B, each primary contact 26 is removably seated to the bushing plate 27 via a conical metal mounting ring 29 engaging a conical portion 33 of the contact 26. Typically, bushing plate 27 comprises a glass reinforced polyester, porcelain, or epoxy material, and is configured to support the weight of the contact and preferably auxiliary hardware, such as current transformers (not shown). In the embodiment shown, bushing plate 27 is configured to be affixed to a compartment wall of the switchgear 12, and that holds three primary contacts 26 (one for each pole). As may be appreciated, however, other bushing configurations may be utilized herein, including single bushing assembly (one for each primary contact). In operation in the switchgear embodiment of the type shown in FIG. 1, two bushing plates 27 are stacked and affixed to a compartment wall of the switchgear 12, providing six primary contacts (two per pole) adjacent circuit breaker 18, for attachment thereto.

Figure 4:
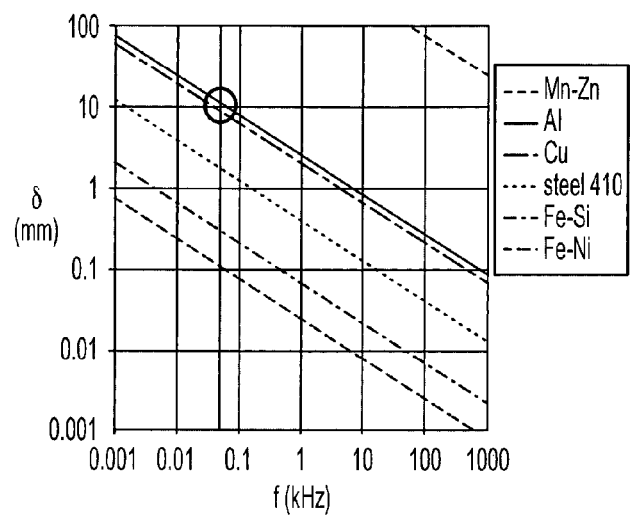
FIG. 4 is a graph showing that at 60 Hz most of current (skin effect) flows in the outermost 10 mm of material.
Figure 5A:
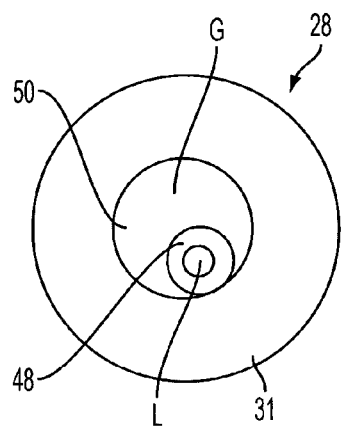
FIG. 5A shows a cross-section of an embodiment of the busbar tube structure defining a busbar tube having a wall thickness based on the graph of FIG. 4, shown with the liquid-return tube therein.
Figure 5B:
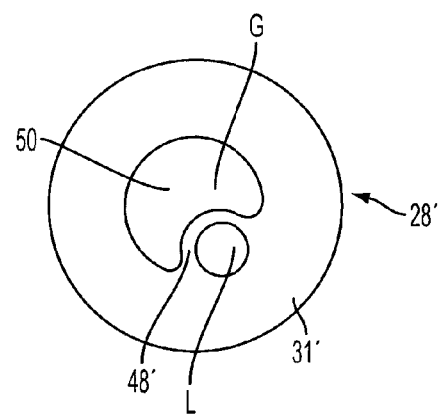
FIG. 5B shows an alternative busbar tube structure of an extruded profile with at least two independent channels, separating liquid and vapor phase of the working fluid.

With reference to FIG. 4, it can be seen that at 60 Hz, most current flows in the outermost 10 mm of material and is known as skin effect. Based on this information and with reference to FIG. 5A, the busbar tube structure 28 includes a busbar tube 31 preferably made of copper or aluminum with an inner diameter of about 12 mm and an outer diameter of about 40 mm to provide sufficient wall thickness to carry a current of 4000 A (skin effect). Thus, the busbar tube 31 carries the electric current similar to a conventional busbar. Alternatively, as shown in FIG. 5B, the busbar-tube 31' could be made from an extruded profile with at least two separated channels, channel 50 for vapor G and channel 48' for liquid working fluid L. An insulating portion can be provided as a part of the busbar tube 31', or epoxy can be casted as the conductor is extruded define the two separated channels.

As shown in FIG. 2, each primary contact 26 includes an integral evaporator, preferably in the form of an evaporator chamber 38. Evaporator chamber 38 is generally a longitudinal cavity or chamber having a first end 40 that comprises an aperture 42 that is adapted to be in fluid connection with fluid conduit structure, generally indicated at 44, and a second end 46 that is closed. As used herein, "fluid conduit structure" generally connotes a single conduit component (e.g., hose, tubing, piping, and the like) or a network of vacuum-tight sealably connected conduit structures that carry the working fluid (described below), either in a condensed state or an evaporated state, between evaporator chamber 38 and a condenser 30. The evaporator chamber 38 can be defined by an external evaporator compartment that is thermally and mechanically connected to the primary contacts—hereinafter referred to as an "attached evaporator." In general, an attached evaporator is suitable for use herein if it is has sufficient thermal and mechanical connection to a primary contact; if it has sufficient cross-sectional area that is in thermal contact with the primary contact; and if it has a sufficient interior volume for receiving working fluid and any flow separation and equilibrium tubing components that may be utilized in the particular embodiment. As shown in FIG. 1, the condenser 30 is located at a higher elevation that the evaporator chambers in the primary contacts 26. Alternatively, the primary contact 26 can be part of the busbar-tube 31 with the evaporator chamber 38 being a lower-most part of the busbar tube 31.

With reference FIGS. 2 and 3, the fluid conduit structure includes a liquid-return tube 48 in fluid communication with the evaporation chamber 38. Liquid-return tube 48 is preferably a plastic tube disposed within an internal cavity 50 of the busbar tube 31 and extends to the condenser 30. In the embodiment, a portion of the liquid-return tube 48 resides within the evaporator chamber 38 and functions to carry condensed (liquid) working fluid 45, depicted as a dotted line, toward second end 46 of evaporator chamber 38. This arrangement helps minimize a condition wherein evaporated (gaseous) working fluid, depicted as arrows, traveling upstream vigorously toward the condenser 30 interrupts the flow of condensed (liquid) working fluid 45 traveling downstream from the condenser 30 toward the hot spot—a condition known as "vapor pillow formation," or counter-current flow limit. Also, the liquid-return 48 helps thermally insulate the condensed working fluid such that an increased amount of condensed working fluid is delivered to the desired region or hot spot, as compared to an otherwise identical embodiment that lacks a terminal flow separation hose. End 52 of the liquid-return 48 extends partially into evaporation chamber 38. The extent to which end 52 extends into evaporation chamber 38 may vary from 0% to 100% depending on the desired cooling performance and the performance characteristics of the particular switchgear configuration in question. In one embodiment, end 52 extends from 50% to 99% of the full distance into evaporation chamber 38. In another embodiment, end 52 extends from 75% to 95% of the full distance into evaporation chamber 38.

A first, flanged end 54 of the busbar tube 31 is coupled to an associated primary contact 26 via the bolt holes 34 and using a metallic sealing ring 56 (FIG. 2), creating a vacuum-tight seal. The metallic sealing ring 56 is small compared to the contact area, thus the electrical contact is not diminished. A second end 58 of the busbar tube 31 extends to a connector 60 that connects with insulating tubing structure 62. In the embodiment, primary contacts 26 and busbar tube 31 are at the same electrical potential, while the condenser 30 is at a relatively low or ground electrical potential. In order to bridge the potential difference, at least one portion of the fluid conduit structure 44 should be comprised of an electrically insulating material. Non-limiting examples of sufficient insulating materials are ceramic and glass materials, including glass-fiber-reinforced epoxy resin, other plastic and rubber materials, including any cast processed tubing, and the like. In the embodiment, the insulating tubing structure 62 is the electrically insulating component, and is comprised of epoxy resin. As may be appreciated, other configurations may be utilized for insulating tubing structure 62 and still be encompassed herein.

If the cooling system is intended to form an electrical isolation gap, an electrically insulating working fluid needs to be provided. Non-limiting examples of suitable working fluids are refrigerants such as hydrofluorocarbons (e.g. R134a, R245fa), fluorketones (e.g., NOVEC-649™, commercially available from 3M), and hydrofluoroethers (e.g., HFE-7100™, commercially available from 3M).

As shown FIG. 1, the insulating tubing structure 62 is fluidly coupled to condenser tubing structure 63, which is fluidly coupled to the condenser 30. Instead of providing a separate condenser tubing structure, the insulating tubing structure 62 can extend directly to the condenser 30. Thus, in the embodiment, the fluid conduit structure 44 includes the busbar tube structure 28, the insulating tube structure 62 and the condenser tube structure 63, and the liquid-return tube 48 disposed therein. For insulation purposes, the busbar tube 31 may be casted with epoxy and the connection 60 with the insulating tubing structure 62 can be covered with a silicone lid (not shown).

Figure 6:
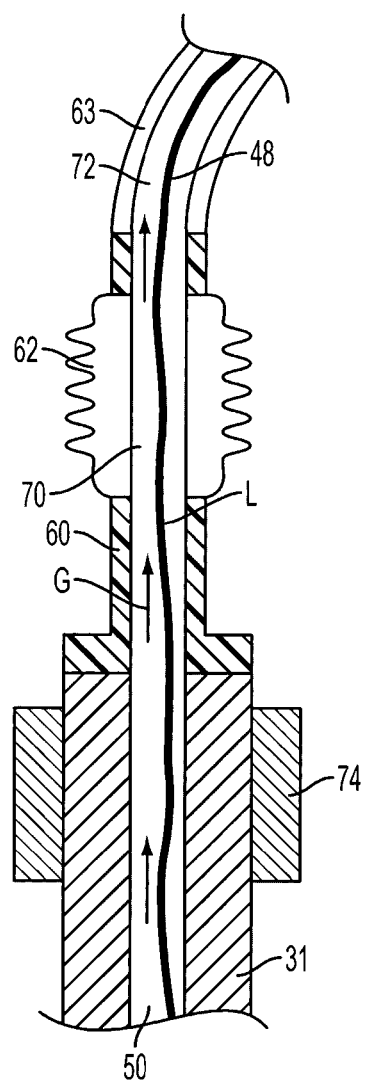
FIG. 6 is an enlarged view showing connections between the condenser tubing structure, the insulating tubing structure and the busbar tube structure.

With reference to FIG. 6, the liquid-return tube 48 extends through the busbar tube 31, through the insulating tubing structure 62, through the condenser tubing structure 63 and to the condenser 30 (FIG. 1). However, instead of providing the single liquid-return tube 48, the tube 48 can be divided into multiple sections and connected together.

The heat pipe structure 10 operates to cool a first location by transferring heat from the first location to a second location via the use of the working fluid 45. Liquid (L) working fluid 45 resides in the bottom of each evaporator chamber 38. Heat from the of the primary contact 26 and busbar tube 31 causes the liquid working fluid 45 to evaporate, primarily in the evaporator chamber 38. Thereafter, the working fluid 45 (mainly in a gaseous or vapor state G) travels upstream through the internal cavity 50 of the busbar tube 31, through the internal cavity 70 of the insulating tubing structure 62, through internal cavity 72 of the condenser tubing structure 63 and to the condenser 30 where the heat is released as a substantial portion of the evaporated working fluid condenses back to a liquid state. The condensed (e.g., liquid L) working fluid 45 then travels downstream from the condenser 30, through the liquid-return tube 48 and back to the evaporator chamber 38 to complete the cooling cycle. The condenser 30 is preferably mounted to a top portion of the enclosure 14 and can be located on the exterior, interior or partially on both the interior and exterior of the enclosure 14 so that the condenser 30 can exchange heat with abundant ambient airflow.

Thus, the busbar tube structure 28 advantageously not only provides the busbar function of the switchgear 12 via busbar tube 31, but also permits the working fluid 45 be directed to and from the condenser 30 via the internal cavity 50 of the busbar tube 31 and the liquid-return tube 48 inside the busbar tube 31. Therefore, the primary contact 26 and the associated busbar tube 31 are cooled as well as the busbar joints 74The vapor/liquid flow is decoupled from the conducting section above the joints 74 by the electrical insulated tubing structure 62.

The primary contact 26 may be made removable, offering the assembling of the entire heat pipe structure 10 as one device in parallel to the switchgear installation. The primary contact 26 could be made one piece with the busbar tube in order to reduce the number of sealing (improve tightness) and components (cost). The electrical insulating tubing structure 62 is not attached to the primary contact 26, but is shifted beyond the busbar joint 74, where more free space is available in the switchgear 12. The busbar tube 31 and the primary contacts 26 may be made of aluminum which offers a further material cost reduction and ease of installation due to its lower weight. This comes at the cost of higher losses, thus additional heat, which is removed by the heat pipe structure 10. At the side of the primary contact 26, the busbar tube 31 would need to be silver-plated, which is a standard process. Furthermore, the epoxy coating is easy to apply and durable for aluminum to provide electrical insulation.

Thus, it can be appreciated that the busbar tubes 31 and the busbar-joints 74 are cooled by means of the heat pipe structure 10 as well as the primary contacts 26. The heat pipe structure 10 provides space-saving all-in-one system with the combination of busbar tube 31 and liquid-return tube 48. Full assembly and testing of heat pipe structure 10 can be performed prior to installation into the switchgear when the primary contacts 26 are made removable. Ease of installation is provided due to the combined busbar tube 31 and liquid-return tube 48, since there is reduced risk of damage of the tubing because there is no need for subsequent installation of the conventional heavy busbars.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A cooling apparatus for a switchgear, the switchgear having at least one primary contact constructed and arranged to connect to a terminal of a circuit breaker, the cooling apparatus comprising:
   an evaporator integral with the at least one primary contact, such that an evaporator chamber of the evaporator is defined within the at least one primary contact,
   a condenser located at a higher elevation than the evaporator,
   fluid conduit structure fluidly connecting the evaporator with the condenser, a portion of the fluid conduit structure defining a busbar tube electrically connected with the at least one primary contact and defining a busbar of the switchgear, and
   working fluid in the evaporator chamber so as to be heated to a vapor state, with the fluid conduit structure being constructed and arranged to transfer the vapor to the condenser and to passively return condensed working fluid back to the evaporator chamber for cooling the at least one primary contact and the associated busbar tube,
   wherein the apparatus is in combination with a plurality of primary contacts, wherein each evaporator comprises an evaporation chamber formed in an associated primary contact, and
   wherein each evaporation chamber has a closed first end proximate the circuit breaker and an opened end opposite the closed end, the busbar tube being sealingly coupled to the opened end.

2. The apparatus of claim 1, wherein in the busbar tube is made of electrically conductive material and is constructed and arranged to carry current of about 4000 A.

3. A cooling apparatus for a switchgear, the switchgear one or more primary contacts constructed and arranged to connect to a terminal of a circuit breaker, the cooling apparatus comprising:
an evaporator constructed and arranged to be associated with each primary contact,
a condenser located at a higher elevation than the evaporator,
fluid conduit structure fluidly connecting the evaporator with the condenser, a portion of the fluid conduit structure defining a busbar tube electrically connected with an associated primary contact and defining a busbar of the switchgear, and
working fluid in the evaporator so as to be heated to a vapor state, with the fluid conduit structure being constructed and arranged to transfer the vapor to the condenser and to passively return condensed working fluid back to the evaporator for cooling the one or more primary contacts and the associated busbar tube,
wherein in the busbar tube is made of electrically conductive material and is constructed and arranged to carry current of about 4000 A, and
wherein the busbar tube is copper having an inner diameter of about 12 mm and an outer diameter of about 40 mm.

4. The apparatus of claim 1, wherein a first end of the busbar tube is sealingly connected with an associated primary contact.

5. The apparatus of claim 4, wherein in the first end is a flanged end coupled to the associated primary contact with a metal sealing ring there-between.

6. The apparatus of claim 1, wherein the busbar tube includes an internal cavity, a liquid-return tube of the fluid conduit structure being disposed in the internal cavity and in communication with the evaporator, whereby vapor is directed from the evaporator through the internal cavity and to the condenser, with the condensed working fluid being directed from the condenser and through the liquid-return tube back to the associated evaporator.

7. The apparatus of claim 1, wherein at least a portion of the fluid conduit structure is electrically insulating.

8. The apparatus of claim 7, wherein the working fluid is electrically insulating and selected from the group consisting of hydrofluorocarbon, fluoroketone, and hydrofluoroether refrigerants, and any mixtures thereof.

9. The apparatus of claim 4, wherein at least a portion of the fluid conduit structure is electrically insulating and is coupled to a second end of the busbar tube.

10. The apparatus of claim 1, further comprising a bushing plate, each primary contact being removably coupled to the bushing plate.

11. The apparatus of claim 1, wherein the fluid conduit structure comprises:
a liquid-return tube disposed in an internal cavity of the busbar tube and in communicating between an associated evaporator and the condenser,
electrically insulating tubing structure connected to the busbar tube and having an internal cavity, and
condenser tubing structure coupled to the insulating tubing structure and having an internal cavity,
wherein the internal cavities of the busbar tube, the insulating tubing structure and the condenser tubing structure are in fluid communication such that the vapor is directed from the associated evaporator, through the internal cavities to the condenser and the condensed working fluid is directed from the condenser, through the liquid-return tube back to the associated evaporator.

12. The apparatus of claim 1, wherein each primary contact and associated busbar tube is made of aluminum.

13. A method of cooling a switchgear having at least one primary contact constructed and arranged to connect to a terminal of a circuit breaker, the method comprising the steps of:
providing an evaporator integral with the primary contact, such that an evaporator chamber of the evaporator is defined within the at least one primary contact,
providing a condenser located at a higher elevation than the evaporator,
providing fluid conduit structure fluidly connecting the evaporator with the condenser, and providing a working fluid in the evaporator,
electrically connecting a busbar tube of the fluid conduit structure with the primary contact to define a busbar of the switchgear, wherein the evaporation chamber has a closed first end proximate the circuit breaker and an opened end opposite the closed end, the busbar tube being sealingly coupled to the opened end,
transferring heat from the primary contact and the busbar tube to the working fluid to cause the working fluid to evaporate in the evaporator with the evaporated vapor being delivered to the condenser via the fluid conduit structure, and
passively returning the working fluid that condenses in the condenser to the evaporator chamber via the fluid conduit structure.

14. The method of claim 13, wherein the busbar tube includes an internal cavity and the step of providing the fluid conduit structure includes providing a liquid-return tube in the internal cavity and in communication with the evaporator, whereby the step of transferring heat includes directing vapor from the evaporator through the internal cavity and to the condenser, with condensed working fluid being directed from the condenser and through the liquid-return tube back to the evaporator.

15. The method of claim 13, wherein the step of electrically connecting the busbar tube includes providing the busbar tube of electrically conductive material so as to carry current of about 4000 A.

16. The method of claim 15, wherein the busbar tube is provided from copper and has an inner diameter of about 12 mm and an outer diameter of about 40 mm.

17. The method of claim 13, wherein the working fluid is provided as an electrically insulating working fluid and the fluid conduit structure includes at least a portion that is electrically insulating.

* * * * *